United States Patent [19]
Naura et al.

[11] Patent Number: 5,995,416
[45] Date of Patent: Nov. 30, 1999

[54] METHOD AND CIRCUIT FOR THE GENERATION OF PROGRAMMING AND ERASURE VOLTAGE IN A NON-VOLATILE MEMORY

[75] Inventors: David Naura; Sébastien Zink, both of Aix En Provence, France

[73] Assignee: STMicroelectronics S.A., Gentilly, France

[21] Appl. No.: 09/156,945

[22] Filed: Sep. 18, 1998

[30] Foreign Application Priority Data

Sep. 19, 1997 [FR] France .................................. 97 11912

[51] Int. Cl.$^6$ .................................................. G11C 16/04
[52] U.S. Cl. ............................... 365/185.18; 365/185.19; 365/185.29
[58] Field of Search ......................... 365/185.18, 185.19, 365/185.29, 185.12, 185.25

[56] References Cited

U.S. PATENT DOCUMENTS

| 5,801,993 | 9/1998 | Choi | 365/185.29 X |
| 5,867,428 | 2/1999 | Ishii et al. | 365/185.18 X |

FOREIGN PATENT DOCUMENTS

| 0762428A1 | 3/1997 | European Pat. Off. . |
| 57-176826 | 10/1982 | Japan . |

OTHER PUBLICATIONS

Lucerno et al., "A 16 kbit Smart 5 v–Only EEPROM with Redundancy", IEEE Journal of Solid–State Circuits, vol. 18, No. 5, Oct. 1983 New York, pp. 539–544.
Gee et al., "An Enhanced 16K E2PROM", EPROM with Reduncancy IEEE Journal Of Solid–State Circuits, vol. 17, No. 5, Oct. 1982, New York—pp. 828–832.
French Search Report (Jun. 2, 1998).

*Primary Examiner*—Huan Hoang
*Attorney, Agent, or Firm*—Gunster, Yoakley, Valdes-Fauli & Stewart, P.A.

[57] ABSTRACT

A method for the generation of voltage for the programming or erasure of a non-volatile memory cell is disclosed. Also disclosed is a circuit and a computer readable medium which implement the method. During an operation of programming or erasure in the memory, the slope P of the write voltage ramp is adapted to the number of memory cells to be programmed or erased simultaneously during this operation. This method is particularly useful in the field of non-volatile, electrically erasable and programmable memories.

13 Claims, 3 Drawing Sheets

METHOD AND CIRCUIT FOR THE GENERATION OF PROGRAMMING AND ERASURE VOLTAGE IN A NON-VOLATILE MEMORY

CROSS-REFERENCE TO RELATED APPLICATIONS

This application is based upon and claims the benefit of the priority of the prior French patent application 97-11912 filed on Sep. 19, 1997, the contents of which are incorporated herein.

BACKGROUND OF THE INVENTION

The present invention relates to a method and circuit for the generation of the voltage for the programming and erasure of a non-volatile memory cell. The invention can be applied in the field of non-volatile programmable and electrically erasable memories (including but not limited to EPROMs, EEPROMs and flash memories).

The memory cells of these memories are based on a technology that makes use of floating-gate transistors. For the programming or erasure of a memory cell of this kind, it is necessary to produce high voltages of about 15 to 20 volts. These voltages are given either by an external voltage source or internally by a load pump integrated into the memory. The programming or erasure voltage applied to a memory cell is shown in FIG. 1. It conventionally has:

- an initial bias at the supply voltage Vcc of the memory constituting a first voltage plateau 10;
- a voltage ramp constituted by a rising phase 11 during which the voltage climbs linearly up to a high voltage $V_H$ and by a voltage plateau 12; and
- a voltage drop 13 during which the voltage returns to the value of the initial voltage.

The rising phase of the voltage ramp is characterized by its slope which is governed by two conditions. First, it should not be excessively high so as not to cause stress on the gate oxide of the cell that is addressed. Indeed, it is indispensable that, during the rising phase, the electrical field within the addressed cell should not vary with excessive suddenness to avoid embrittling and possibly seven damaging the gate oxide of the cell. Second, the build-up time of the voltage ramp must be calculated so that the capacitive charge addressed in the memory does not act on the slope of the ramp. For this purpose, the fan-out S of the load pump responsible for giving the high voltage to the voltage-ramp generation circuit should be greater than the addressed capacitive charge C multiplied by the slope of the ramp, namely it is necessary that:

$$S > C * dV/dt \qquad (1)$$

If this relation is not verified, the slope of the ramp is not controlled and the voltage applied to the memory cell to be written is no longer controlled. The capacitive charge addressed varies as a function of the number of memory cells written simultaneously. The capacitive charge is therefore different depending on whether the memory works in normal mode (byte mode), page mode or global mode.

There are two possible methods by which it can be seen to it that the relationship (1) is always verified:
- either a load pump with high fan-out is provided;
- or a voltage ramp is chosen with a slope small enough for the relationship (1) to be always verified whatever the capacitive charge addressed.

However, these two methods have certain drawbacks. With regard to the first method, it is not always possible to increase the fan-out of the load pump. Indeed, the load pump is conventionally a Schenkel pump whose fan-out is proportional to $C_e * f/n$ where $C_e$ designates the capacitance of a stage of the pump, f designates the pumping frequency and n designates the number of stages of the pump. Increasing the fan-out of the pump makes it necessary to reduce the number of stages n, which is not possible for n fixes the voltage delivered by the pump, or else to increase $C_e$ or f, which is very costly in terms of space taken up on silicon. As for the second method, it entails penalties with respect to memory cell write time and, hence, with respect to the speed of the memory. In particular, it penalizes the operation of the memory in normal mode as compared with the operation in page mode or in global mode.

SUMMARY OF THE INVENTION

Briefly, according to one aspect of the invention, a method for the programming or erasure of a plurality of memory cells of a non-volatile memory comprises three steps. The first step is producing a programming or erasure voltage waveform. The waveform comprises a portion that has a rising voltage, and a portion that has a voltage drop. The portion that has a rising voltage is characterized by a maximum slope P. The second step is selecting the value of P depending on the number of memory cells to be simultaneously programmed or erased. The third step is applying the programming or erasure voltage waveform to the plurality of memory cells to be programmed or erased.

Briefly, according to other aspects of the invention, a circuit and a computer readable medium which implement the above-mentioned method are disclosed.

BRIEF DESCRIPTION OF THE DRAWINGS

Other features and advantages of the invention shall appear from the following detailed description made with reference to the appended drawings, of which.

DETAILED DESCRIPTION OF AN EMBODIMENT

It is an aim of the invention to propose a method for the generation of the write voltage in a non-volatile memory optimizing the time used to write the cells of the memory and a circuit implementing this method. According to the invention, this aim is achieved and the drawbacks of the prior art are attenuated or eliminated by dynamically adapting the slope of the ramp to the capacitive charge addressed. Thus, the performance characteristics of the memory as regards programming or erasure speed are adapted to the customer's requirements, without in any way thereby penalizing the memory with respect to the surface area of silicon taken up by the circuit.

An object of the invention therefore is a method for the programming or erasure of the memory cell of a non-volatile memory comprising the following steps:

producing a programming or erasure voltage comprising a voltage shift equal in value to a reference voltage followed by a voltage ramp with a slope P, a voltage plateau and a voltage drop, and applying this programming or erasure voltage to the memory cells to be programmed or erased, wherein, during a programming or erasure operation in the memory, the slope P of said voltage ramp is adapted as a function of the number of memory cells to be programmed or erased simultaneously during this operation.

Thus, different slope values are associated with the three modes of operation of the memory (normal mode, page mode and global mode).

In a preferred embodiment, the value of the slope in page mode is included between a minimum value and a maximum value. It is defined between these two boundary values as a function of the number of memory cells addressed in page mode, this number being determined during an acquisition step that precedes the generation of the programming or erasure voltage.

The invention also relates to a circuit for the programming or erasure of the memory cells of the non-volatile memory comprising:

a circuit for the generation of a write voltage to generate a programming or erasure voltage comprising a voltage shift equal in value to a reference voltage followed by a voltage ramp with a slope P, a voltage plateau and a drop in voltage, and selection means to apply said programming or erasure voltage to the memory cells to be programmed or erased, wherein the circuit for the generation of the write voltage comprises means to obtain a variation in the slope of the ramp of the programming or erasure voltage as a function of the number of memory cells to be programmed or erased simultaneously.

According to the invention, it is planned, during a write operation, to modulate the slope of the ramp of the write voltage as a function of the number of memory cells addressed simultaneously.

Figure 2:
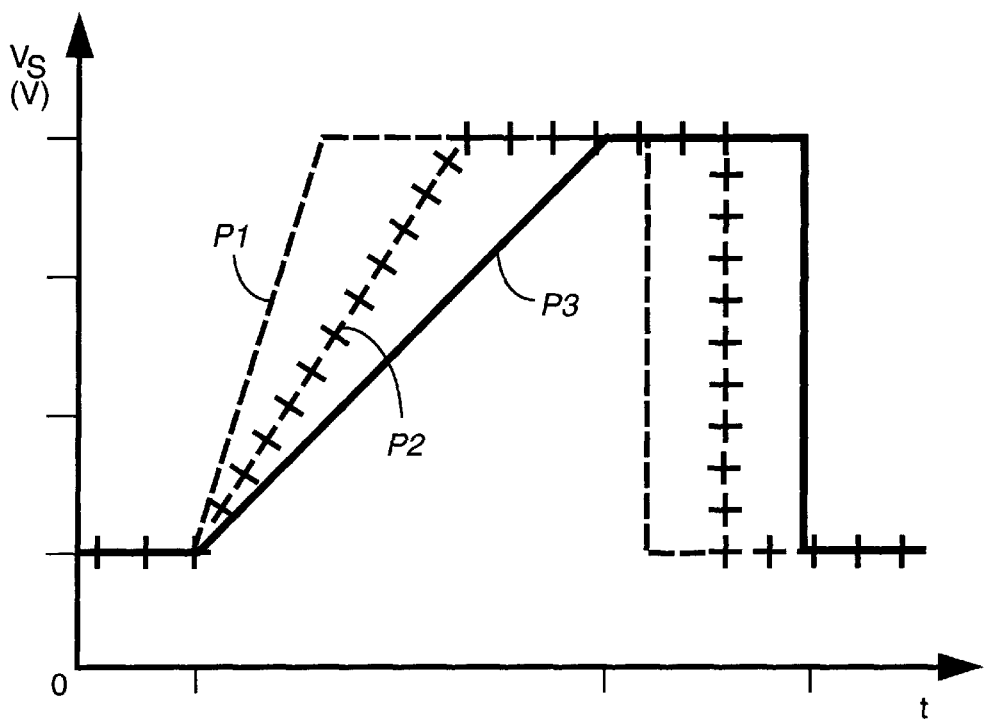
FIG. 2 is a timing diagram of the programming (or erasure) voltages for a memory working in three modes.

A slope value is therefore defined for each write mode of the memory. It is inversely proportional to the number of memory cells designed to receive the write voltage simultaneously. The voltage Vs for the three modes of operation of the memory is shown in FIG. 2. The rising part of this voltage has a slope with a value P1 in normal mode, a slope with a value P2 in page mode and a slope with a value P3 in global mode with P1>P2>P3.

The value P1 is computed so that, for a given fan-out S of the circuit, the relationship S>P1*C1 is verified, with C1 representing the capacitive load of eight parallel-connected memory cells. The value P1 also has a boundary value, beyond which the electrical field is far too intense within the memory cell.

Identically, the value P2 verifies the relationship S>P2*C2 where C2 represents the capacitive load of a page. Generally, the size of a page is equal to 8, 16, 32 or 64 bytes. In a first embodiment, the value P2 is independent of the size of the page and is therefore taken as being equal to the value corresponding to a page of maximum size, namely 64 bytes. In an improved embodiment described further below, the size of the page is determined in a first step and a slope P2 that is a function of this size is generated.

Finally, the value P3 is determined similarly as a function of the capacitive load C3 in global mode.

According to the invention, the slope variation is obtained by charging a capacitor at variable speeds. A circuit implementing the method of the invention is described in FIGS. 3 and 4. It is aimed at producing a write voltage Vs whose slope of the ramp is a function of the mode of operation of the memory. Alternate embodiments may use other circuits or devices, including but not limited to digital-to-analog converters, for delivering the variable voltage to the memory cells.

Figure 3:
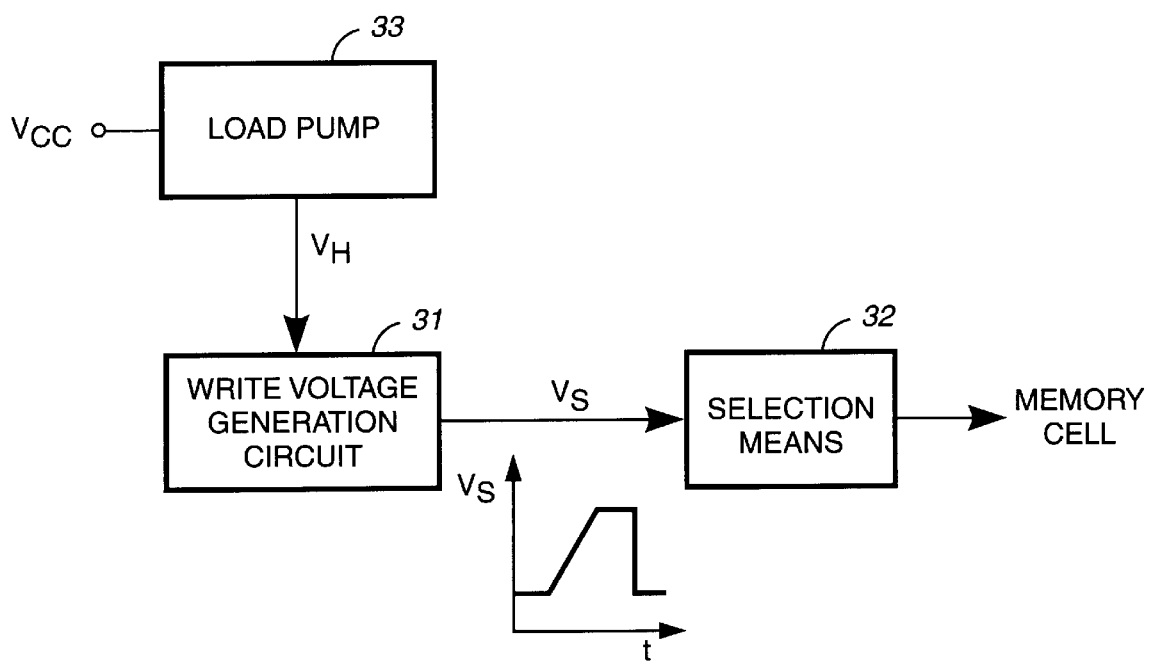
FIG. 3 is a functional diagram of a circuit for the programming or erasure of a non-volatile memory according to the invention.

With reference to FIG. 3, a circuit in accordance with the invention comprises a write voltage generation circuit 31 that delivers the write voltage Vs which is applied to the memory cell or cells by means of selection means 32 that enable the selection of the memory cells to be programmed or erased. The circuit 31 is supplied with a high voltage $V_H$ supplied by a load pump 33.

Figure 4:
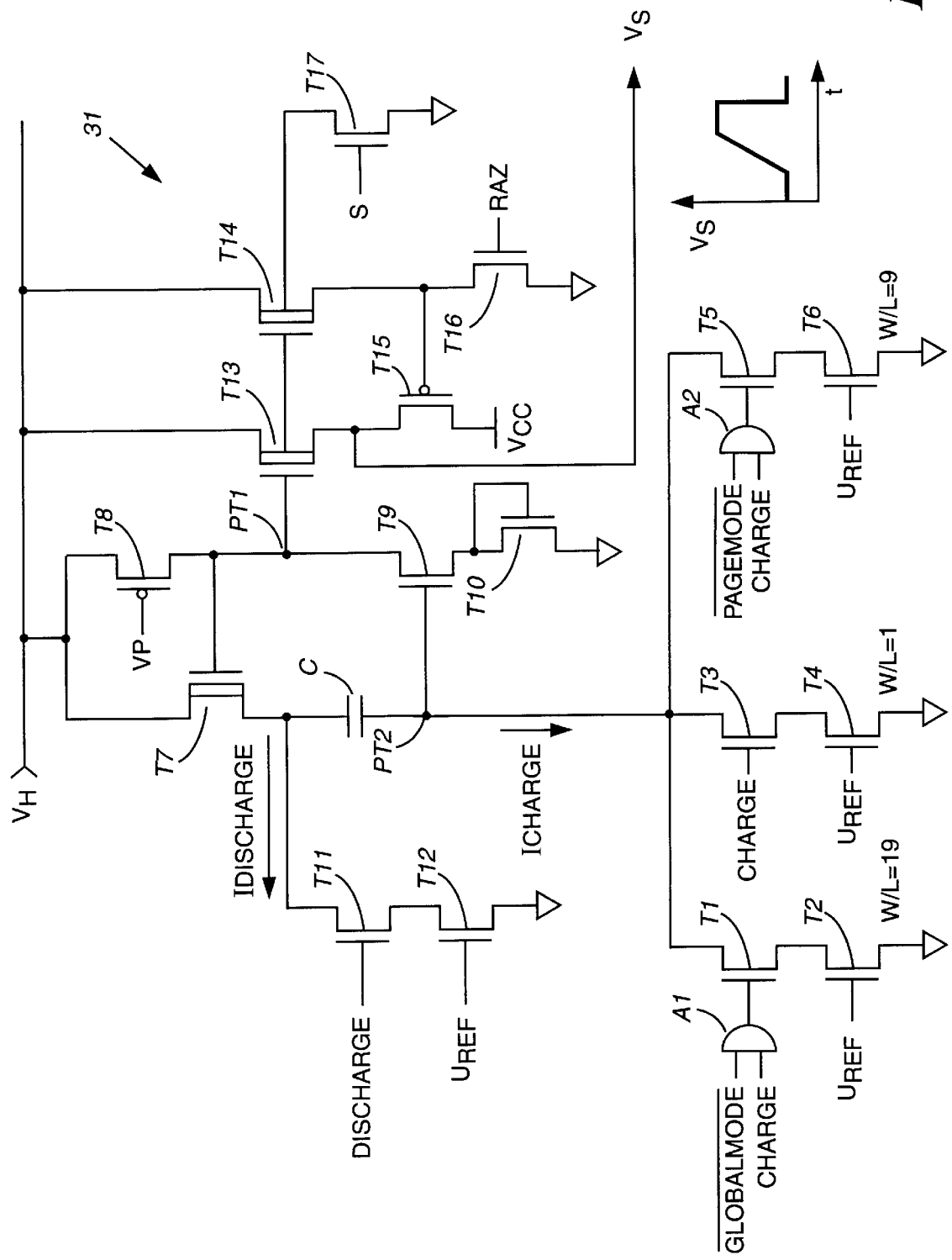
FIG. 4 is an embodiment of the circuit for the generation of the write voltage according to the invention.

The circuit 31 is described in detail in FIG. 4. It includes chiefly:

a capacitor C whose charging time corresponds to the build-up time of the voltage Vs, a circuit for the regulation of the capacitor C charging current, a charging circuit that sets the charging current of the capacitor C, a control circuit for the charging circuit to match the value of the charging current with the number of memory cells to be programmed or erased simultaneously, and a circuit for the discharging of the capacitor C.

To obtain a voltage ramp at the output of the circuit, the capacitor C is charged with a current Icharge. The value of this current determines the charging time of the capacitor C and thereby the build-up time of the voltage ramp. The charging current Icharge is fixed by a charging circuit connected to the lower terminal of the capacitor C.

The charging current Icharge depends on the write mode employed. The three write modes possible are: the page mode, the global mode and the normal mode (byte mode). The charging circuit consists of three arms that are parallel-connected between the lower arm of the capacitor C and the ground. Each arm consists of two N channel MOS transistors that are series-connected. In normal mode, the transistors of the three arms are on in order to set a high charging current while, for the other two modes, only two of the three arms are on.

The first arm consists of two transistors T1 and T2. The transistor T1 is controlled by a signal coming from an AND type logic gate which receives signals CHARGE and GLOBALMODE/ (or GLOBALMODE bar, the inverse of GLOBALMODE) at its inputs. The signal CHARGE is active during the charging of the capacitor C and the signal GLOBALMODE/ is active when the memory is not in global mode. The transistor T2 receives a constant reference voltage $U_{REF}$ at its gate and is used as a constant current source.

The second arm has two transistors T3 and T4. The transistor T3 is controlled by the signal CHARGE and the transistor T4 is controlled by the voltage $U_{REF}$. Finally, the third arm has two transistors T5 and T6. The transistor T5 is controlled by the signal coming from an AND type logic gate A2 which receives the signal CHARGE and a signal PAGEMODE/ (or PAGEMODE bar, the inverse of PAGEMODE) at its inputs. The signal PAGEMODE/ is a logic signal that is active when the memory is not in page mode. The transistor T6 receives the voltage $U_{REF}$ at its gate and is equivalent to a constant current source. The value of the current Icharge is determined by the size of the transistors T2, T4 and T6.

Furthermore, the transistors T1, T3 and T5 work in saturation mode and are used as switches.

In normal mode, the charging current Icharge is equal to the sum of the currents dictated by the transistors T2, T4 and T6. In page mode, the capacitor is charged solely by the current dictated by the transistors T2 and T4. Finally, in global mode, the charging current is equal to the sum of the currents dictated by the transistors T4 and T6.

The size of the transistors T2, T4 and T6 sets the value of the charging current of the three modes. For a page of X bytes, the capacitive charge is X times higher than in normal mode. The result thereof is that the size of the transistor T2 is (X−1) times greater than that of the transistor T4 if it is desired that the value of the charging current should be inversely proportional to the capacitive charge addressed. In practice, this is not done because the circuit would be far too costly in terms of silicon. This is why, in the example of FIG. 4, three charging currents I1, I2 and I3 respectively are chosen for the normal mode, the page mode and the global mode defined as follows: I1=10*I2=20*I3, the respective slopes P1, P2 and P3 of which verify the relationship (1). The W/L ratios of the transistors of the charging circuit are therefore the following: W/L(T4)=1; W/L(T2)=19 and W/L(T6)=9. In this example, it is chosen to penalize the write time in normal mode to limit the size of the transistors T2 and T6. However, this write time remains far smaller than is the case in a standard memory. What is being done here is to obtain a compromise between the size of the circuit (the size of the transistors of the charging circuit) and the gain in write speed.

The circuit 31 furthermore has a circuit to regulate the charging current supplied by the voltage $V_H$ corresponding to the maximum value of the voltage Vs. It has an N channel MOS transistor T7 whose drain receives the voltage $V_H$ and whose source is connected to the upper terminal of the capacitor C. Its gate is furthermore connected to the drain of a P channel MOS transistor T8. The voltage $V_H$ is applied to the source of this transistor and a bias voltage VP slightly smaller than the voltage $V_H$ is applied to its gate.

The circuit for the regulation of the charging current also has a transistor T9 having its gate connected to the lower terminal of the capacitor C, its drain connected to the drain of the transistor T8 and its source connected to the ground by means of a diode-mounted transistor T10. The transistor T10 is used here as a resistor. The current is regulated as follows: if the charging current diminishes, the potential at the lower terminal of the capacitor C diminishes and the transistor T9 becomes more resistant. The potential at the gate of the transistor T7 then rises and the transistor T7 becomes less resistant and the charging current increases.

The circuit 31 also has a discharging circuit connected between the upper terminal of the capacitor C and the ground. This discharging circuit has two transistors T11 and T12 that are series-connected. The transistor is controlled by an active signal DISCHARGE that is active during the phase for discharging the capacitor C. The transistor T12 is controlled by the voltage $U_{REF}$ and is sized so as to discharge the capacitor C at very high speed. The size of the transistor T12 sets the value of this discharging current.

Figure 1:
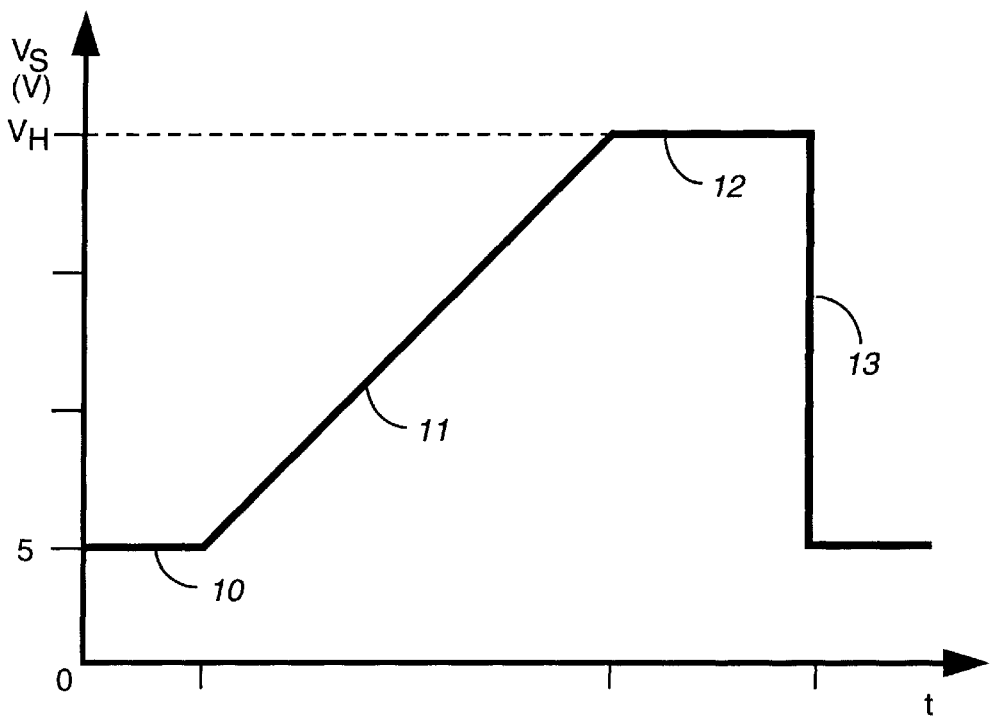
FIG. 1, already described, is a timing diagram of the programming (or erasure) voltage applied to one or more memory cells.

Finally, the circuit has a device to generate the reference voltage of the write voltage shown in FIG. 1. In the example of FIG. 4, the reference voltage is equal to the supply voltage Vcc of the memory. This device has two N channel MOS transistors T13 and T14 having their respective drains supplied by the voltage $V_H$ and their gates connected to the drain of the transistor T8 of the regulation circuit. The source of the transistor T13 is connected to the supply voltage Vcc by means of a P channel MOS transistor T15. The gate of the transistor T15 is connected to the source of the transistor T14. Thus, when the gate voltage of the transistors T13 and T14 is low, the transistor T15 is on and dictates the voltage Vcc on the source of the transistor T13. An additional N channel transistor T16 is designed to cancel the voltage Vs when the circuit is deactivated (with the signal RAZ in the high state). The write voltage Vs is taken at the source of the transistor T13. Finally, the circuit is made complete with an N channel transistor T17 to bring about a drop in the voltage Vs (corresponding to the drop in voltage referenced 13 in FIG. 1) at the end of the operation. This transistor is controlled by a signal S that is active during the phase 13 of the voltage Vs.

The circuit works as follows: during a charging phase corresponding to the rising phase of the voltage Vs, the capacitor C gets charged and the voltage at its terminals gradually increases. The value of the current Icharge is variably high depending on the state of the signals PAGEMODE/ and GLOBALMODE/. Hereinafter in the description, the potentials PT1 and PT2 respectively designate the potential at the gate of the transistor T13 and the potential at the lower terminal of the capacitor. As and when the potential of the upper terminal of the capacitor C increases, the potential PT1 and the voltage Vs increase. A time comes when the potential PT1 reaches the maximum level. The capacitor C continues to get charged and the potential PT2 falls. When the potential PT2 then becomes smaller than the threshold value of the transistor T9, this transistor goes off. The charging is then interrupted and the discharging of the capacitor is initiated. During the discharging phase, the voltage Vs is kept at its maximum value for the transistor T9 is off. During this phase, the voltage Vs has a voltage plateau (referenced 12 in FIG. 1). The potential at the upper terminal of the capacitor drops as and when the capacitor gets discharged and the signal DISCHARGE is deactivated when the potential goes below a threshold potential. At this precise instant, the signal S becomes active, the transistor T17 comes on and the voltage Vs drops (this is the phase 13 in FIG. 1) to the reference value Vcc dictated by the transistor T15.

This circuit has been designed to produce a write voltage Vs that is particular for memory write mode.

In an improved embodiment, it is possible to consider making the slope of the voltage Vs in page mode more precise in taking account of the exact number of memory cells addressed per page. To do so, it is enough to make a count of the memory cells addressed in page mode before generating the voltage Vs and associating a particular value of charging current with the value obtained. In practice, a count is made of the number of clock pulses Nh needed to load the page into the buffer circuits of the memory before the programming of the page in the cells of the memory, and the charging current in page mode is adapted to this number. It is enough for example to have a six-bit counter (counting up to 64) to acquire the number Nh and, instead of the transistor T2, four identical parallel-connected transistors each dictating a charging current I. Following the counting step or the acquisition phase, the following are activated:

four transistors if Nh<8,
three transistors if 8≦Nh<16,
two transistors if 16≦Nh<32, and
one transistor if Nh≧32.

The charging current is then a function of the number of bytes included in a page.

The present invention can be implemented by hardware, software, or a combination of both. Moreover, at least some of this functionality may be embodied in computer readable media such as 3.5 inch diskettes to be used in programming an information-processing apparatus to perform in accordance with the invention. This functionality may also be embodied in computer readable media such as a transmitted waveform to be used in transmitting the information or functionality.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

We claim:

1. A method for the programming or erasure of a plurality of memory cells of a non-volatile memory, the method comprising the steps of:

produce a programming or erasure voltage waveform comprising a portion that has a rising voltage, and a portion that has a voltage drop, wherein the portion that has a rising voltage is characterized by a maximum slope P;

selecting the value of P depending on the number of memory cells to be simultaneously programmed or erased; and applying the programming or erasure voltage waveform to the plurality of memory cells to be programmed or erased.

2. The method of claim 1, wherein the step of producing a programming or erasure voltage waveform comprises:

producing a programming or erasure voltage waveform comprising a portion that has voltage shift equal to a reference voltage, followed by a portion with a rising voltage, followed by a voltage plateau, and followed by a voltage drop, wherein the portion of the voltage waveform that has a rising voltage has a constant slope equal to the maximum slope P.

3. The method of claim 1, wherein the step of selecting the value of P comprises selecting the value of P such that P has:

a first value when a group of n memory cells is to be programmed or erased simultaneously, where n is a positive integer;

a second value when a plurality of groups of n memory cells is to be programmed or erased simultaneously, wherein the second value is less than the first value; and a third value when the totality of the cells of the memory or of a sector of the memory is to be programmed or erased simultaneously, wherein the third value is less than the second value.

4. The method of claim 3, wherein the slope is proportional to the charging time of a capacitor and wherein the three slope values are associated with three charging times of the capacitor.

5. The method of claim 3, wherein the second value ranges between a minimum boundary value and a maximum boundary value, and is defined between these boundary values as a function of the number of groups of n memory cells to be simultaneously programmed or erased.

6. A circuit for the programming or erasure of a plurality of memory cells of a non-volatile memory, the circuit comprising:

means for producing a programming or erasure voltage waveform, the waveform comprising a portion that has a rising voltage, and a portion that has a voltage drop, wherein the portion that has a rising voltage is characterized by a maximum slope P;

means for selecting the value of P depending on the number of memory cells to be simultaneously programmed or erased; and means for applying the programming or erasure voltage waveform to the memory cells to be programmed or erased.

7. The circuit of claim 6, wherein the means for producing a programming or erasure voltage waveform comprises:

means for producing a programming or erasure voltage waveform comprising a portion that has voltage shift equal to a reference voltage, followed by a portion with a rising voltage, followed by a voltage plateau, and followed by a voltage drop, wherein the portion of the voltage waveform that has a rising voltage has a constant slope equal to the maximum slope P.

8. The circuit of claim 7, comprising:

a capacitor;

a charging circuit coupled to the capacitor, wherein the charging circuit imposes a charging current for the charging of the capacitor; and a control circuit, coupled to the charging circuit, wherein the control circuit controls the charging circuit to adapt the value of the charging current to the number of memory cells to be programmed and erased simultaneously.

9. The circuit of claim 8, wherein:

the charging circuit comprises a first transistor, a second transistor, and a third transistor, each of which is coupled to the capacitor and to a common reference;

the control circuit comprises:

a first transistor, disposed between the capacitor and the first charging circuit transistor, which acts as a switch;

a second transistor, disposed between the capacitor and the second charging circuit transistor, which acts as a switch;

a third transistor, disposed between the capacitor and the third charging circuit transistor, which acts as a switch;

a first AND-type logic gate, connected to the gate of the first control circuit transistor, which controls the first control circuit transistor; and a second AND-type logic gate, connected to the gate of the third control circuit transistor, which controls the third control circuit transistor; and the control circuit imposes: a first value of charging current when the first and second control circuit transistors are switched on, a second value of charging current when the second and third control circuit transistors are switched on, and a third value of charging current when all three of the control circuit transistors are switched on.

10. The circuit of claim 6, wherein the means for producing a programming or erasure voltage waveform comprises a digital-to-analog converter ("D/A"), the D/A being used to control the variance in the voltage waveform.

11. A computer readable medium containing program instructions for the programming or erasure of a plurality of memory cells of a non-volatile memory, the program instructions comprising instructions for:

producing a programming or erasure voltage waveform comprising a portion that has a rising voltage, and a portion that has a voltage drop, wherein the portion that has a rising voltage is characterized by a maximum slope P;

selecting the value of P depending on the number of memory cells to be simultaneously programmed or erased; and applying the programming or erasure voltage waveform to the plurality of memory cells to be programmed or erased.

12. The medium of claim 11, wherein the instructions for selecting the value of P comprise instructions for:

selecting a first value for P when a group of n memory cells is to be programmed or erased simultaneously, where n is a positive integer;

selecting a second value for P when a plurality of groups of n memory cells is to be programmed or erased simultaneously, wherein the second value is less than the first value; and selecting a third value for P when the totality of the cells of the memory or of a sector of the memory is to be programmed or erased simultaneously, wherein the third value is less than the second value.

13. The medium of claim 12, wherein:

the instructions for selecting a first value for P comprise instructions for activating a plurality of transistors, the activation allowing a first charging current to charge a capacitor;

the instructions for selecting a second value for P comprise instructions for activating a first subset of the plurality of transistors, the activation allowing a second charging current to charge the capacitor, the second charging current being smaller than the first charging current; and the instructions for selecting a third value for P comprise instructions for activating a second subset of the plurality of transistors, the activation allowing a third charging current to charge the capacitor, the third charging current being smaller than the second charging current.

* * * * *